United States Patent [19]

Morrison et al.

[11] 3,942,701

[45] Mar. 9, 1976

[54] MACHINE FOR FORMING AND INSERTING COMPONENT LEADS

[75] Inventors: Ralph A. Morrison, Topsfield; Waldo B. Hanson, Rowley, both of Mass.

[73] Assignee: USM Corporation, Boston, Mass.

[22] Filed: Dec. 30, 1974

[21] Appl. No.: 537,341

[52] U.S. Cl. ............................................. 227/90
[51] Int. Cl.² ......................................... B25C 5/08
[58] Field of Search ............ 227/85, 86, 87, 88, 89, 227/90, 91

[56] References Cited
UNITED STATES PATENTS

| | | | |
|---|---|---|---|
| 2,960,695 | 11/1960 | Hausknecht | 227/90 X |
| 2,987,729 | 6/1961 | Taynton | 227/89 |
| 3,488,672 | 1/1970 | Martyn | 227/88 X |

Primary Examiner—Granville Y. Custer, Jr.
Attorney, Agent, or Firm—Carl E. Johnson; Vincent A. White; Richard B. Megley

[57] ABSTRACT

A reciprocable member for inserting the leads of electronic components into preformed holes of circuit boards and the like is provided with a hold-down means cooperative with an inside former whereby portions of the leads are predeterminedly positioned and clamped during trimming and stand-off formation and then, at a later stage of an operating cycle, allows the member to insert the cut leads up to the stand-off formation. A mounting machine also desirably includes an inside former of improved configuration inducing lead retention in an outside former, and mechanism whereby the bodies of successive overlapping tape-fed components to be mounted are uniformly positioned for such lead clamping, forming and insertion.

9 Claims, 20 Drawing Figures

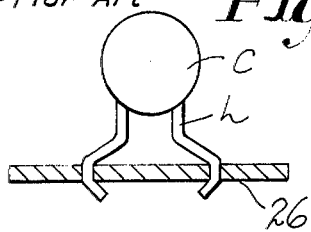
"Prior Art" Fig. 1
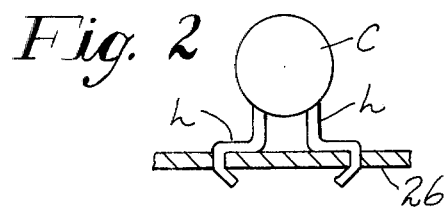
Fig. 2
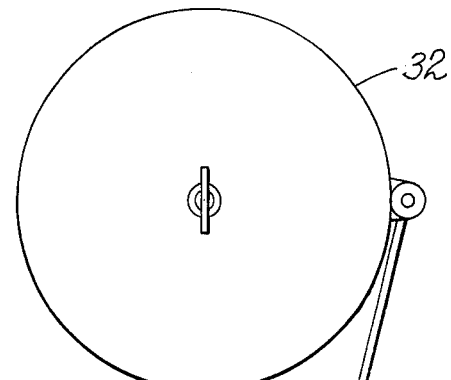
Fig. 3
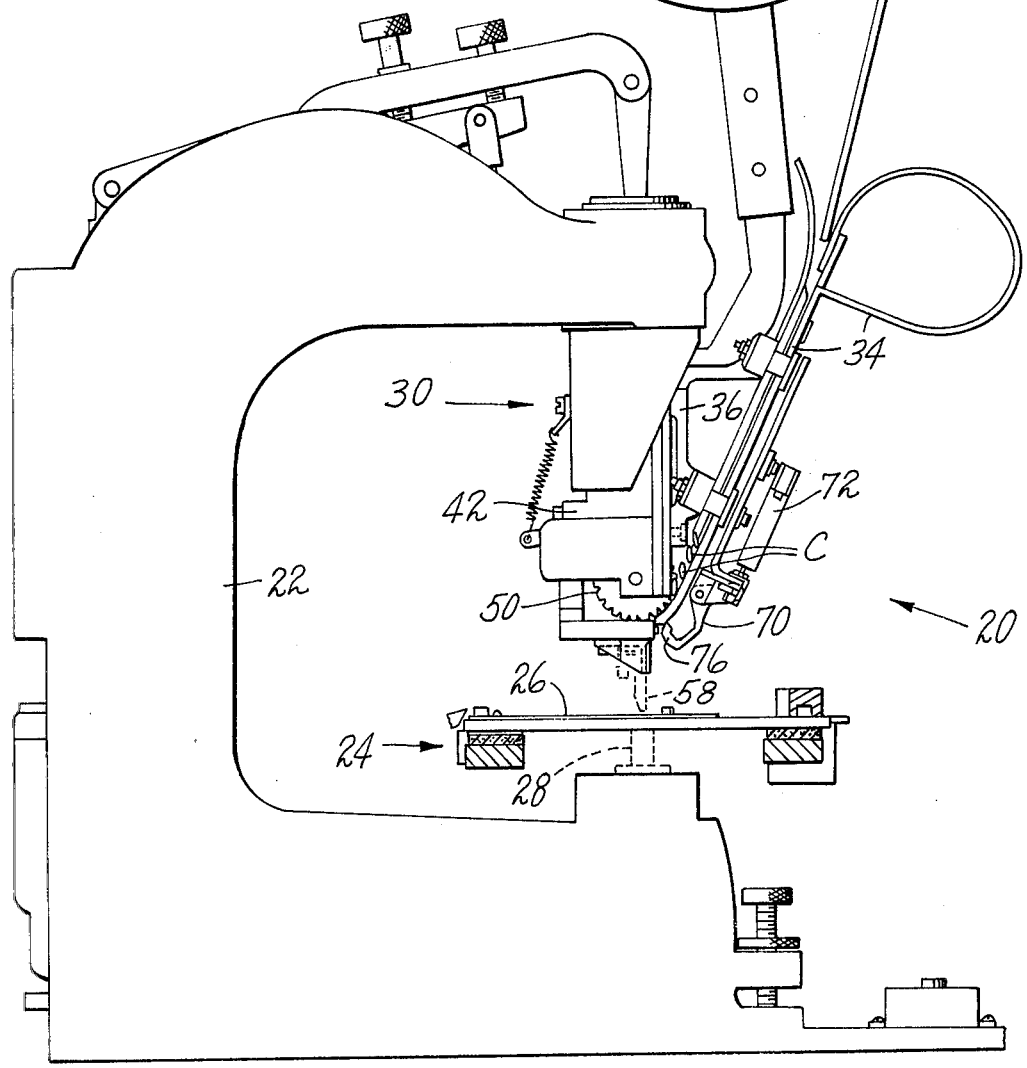

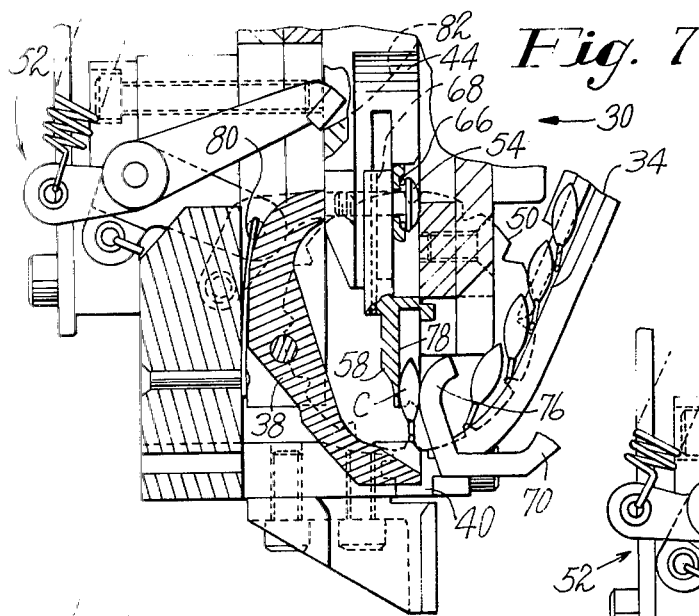
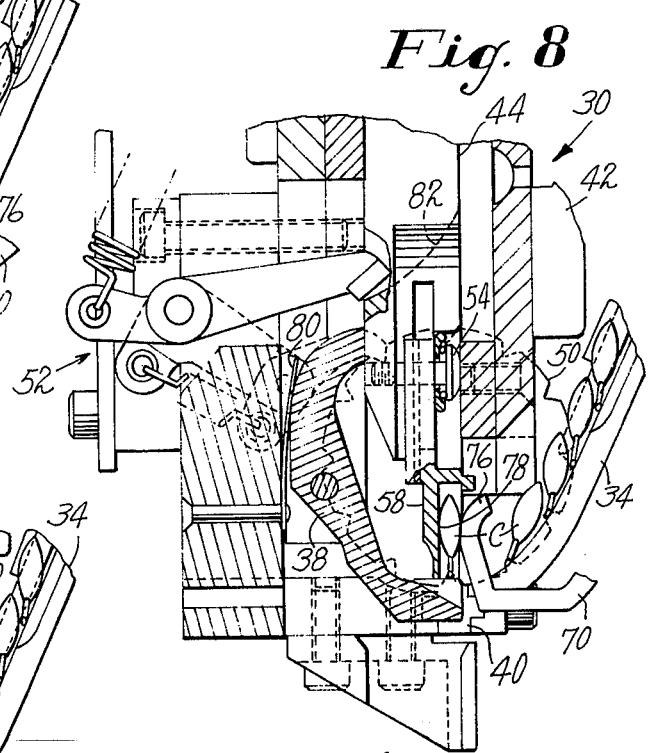
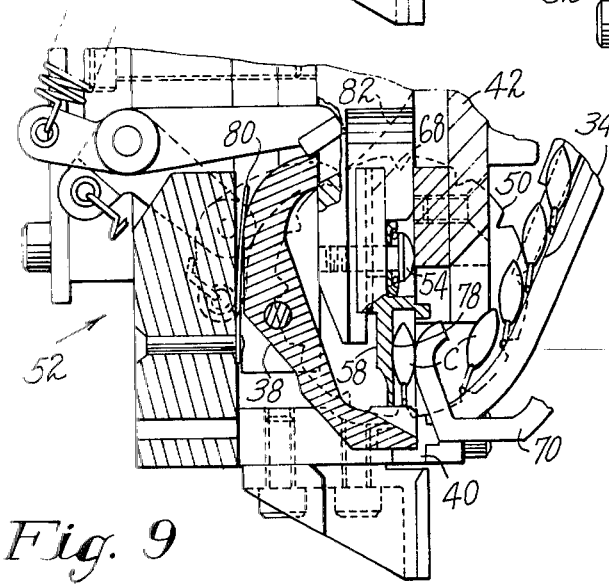
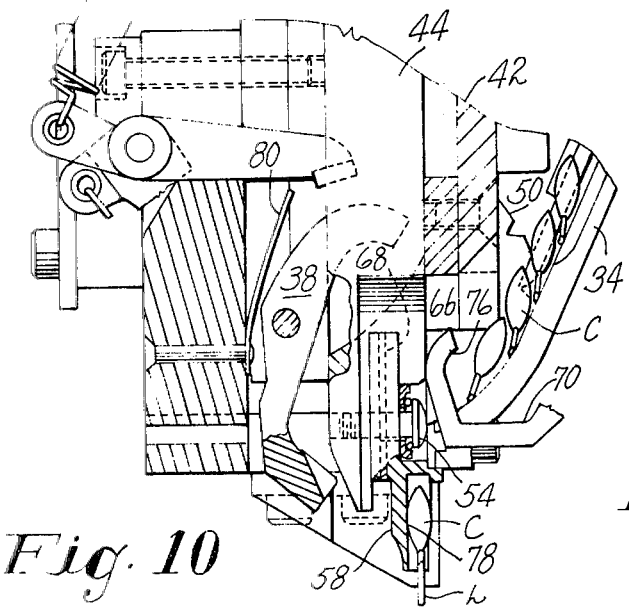
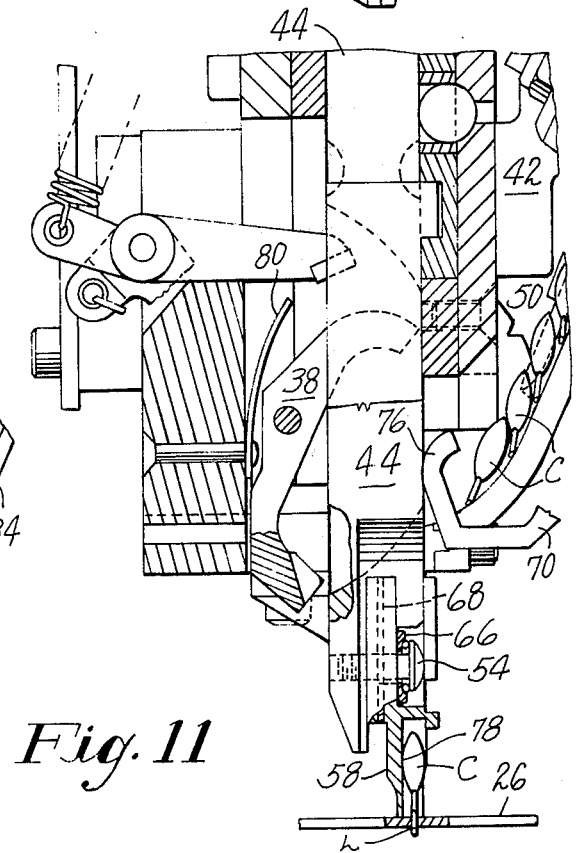

MACHINE FOR FORMING AND INSERTING COMPONENT LEADS

BACKGROUND OF THE INVENTION

This invention relates to machines for mounting lead-bearing components, and is not restricted to use in mounting any particular form of component. More particularly it is concerned with providing improved means for cutting and forming the leads of successive components such as disc capacitors (disc caps) or the like having a portion of their leads disposed radially or parallel, especially when the leads are to provide stand-off mounting of their component bodies.

As disclosed, for instance, in U.S. Pat. No. 2,896,213 issued July 28, 1959 in the names of Alderman et al, a widely known and used machine for cutting, forming and inserting the leads of successive coaxial lead-type electrical components comprises a reciprocable driver, lead cutting tools, lead forming means including inside and outside formers, means for feeding successive components to the aforesaid instrumentalities, and power means for operating them cyclically in appropriate sequence. So-called radial or parallel lead-type components have also been processed for circuit board mounting in machines of that type and in other machines, for instance those disclosed in U.S. Pat. Nos. 2,850,737 and 3,777,350.

Because the lead receiving holes of circuit boards customarily afford little clearance for the respective wire leads to be inserted endwise therethrough after they have been cut to proper length and formed as may be required, it is essential to attaining a high degree of reliability in inserting machines that the cutting and forming means control the leads precisely at each stage. A major difficulty encountered in prior inserting machines, especially with disc cap inserters, has been that the leads have not been fixedly secured as they were being cut and formed and then sufficiently retained in the formers, and accordingly they would often prematurely separate and fall from control of the outside formers during the lead inserting stroke. One or both leads would then fail to be inserted and electrically connected in its circuit. Additionally it is found important to establishing and maintaining upright mounting of each component body above its circuit board that the leads be bent substantially at right angles without stressing the component body and placed in parallel relation with the upper surface of the board before being projected therethrough for clinching.

SUMMARY OF THE INVENTION

In view of the foregoing it is a primary object of this invention to provide in a component lead forming and inserting machine an improved means for insuring that the leads of each component to be mounted on a circuit board, or the like, will be angularly formed to securely grip the board in a manner to hold the body of the component fixedly spaced therefrom.

Another object of this invention is to provide a highly reliable machine for mounting radial or parallel lead-type components in stand-off fashion on circuit boards when the components are fed to the mounting means by lead-carrying tapes storing the component bodies in overlapped relation.

A further and more specific object of the invention is to provide a machine for successively bending and mounting the leads of disc caps and the like which are fed from a supply tape and are to have substantially 90°-bent lead portions grippingly engaging opposite sides of a support.

To these ends and as herein shown, a feature of the invention resides in providing means for immobilizing portions of the leads of a component with respect to an inside former supporting it when other portions of the respective leads are being trimmed and bent by a cooperating cutter and outside former whereby the latter can carry and accurately guide the cut lead ends after they have been formed. More particularly the lead immobilizing means advantageously provided in an illustrative embodiment employs a hold-down means frictionally coupled to an inserter or driver bar for an initial portion of its stroke and thus operable during a cutting and lead forming portion of each cycle to insure that the formers cooperate precisely as intended without permitting premature separation of the leads from the formers. A further feature relates to incorporation of an inside former having a novel shape or character conducive to enakling retention and control of formed leads by the outside lead forming means.

BRIEF DESCRIPTION OF THE DRAWINGS

The foregoing and other features of the invention will now be more particularly described in connection with an illustrative embodiment and with reference to the accompanying drawings thereof, in which:

FIG. 1 is a view in elevation, with lead formation somewhat exagerated, of a disc cap component as mounted by prior art mechanism;

FIG. 2 is a view similar to FIG. 1 showing stand-off disc cap lead formation as effected by the present invention;

FIG. 3 is a view in side elevation of a component inserting machine, for instance of the general type shown in the mentioned Alderman et al patent, as modified by the present invention for reliably effecting mounting of tape-fed disc caps or the like on circuit boards;

FIGS. 7–11 inclusive show positions of the instrumentalities in a cycle from full driver bar retraction to lead insertion as indicated in FIG. 2;

DESCRIPTION OF PREFERRED EMBODIMENT

The following description pertains to disc cap insertion by way of example only; it will be understood that this invention is applicable to the insertion of different body sizes of disc capacitors and also to the formation and insertion of other components whether their leads project radially or otherwise from their bodies and even if the latter are of widely different shapes.

Figure 17:
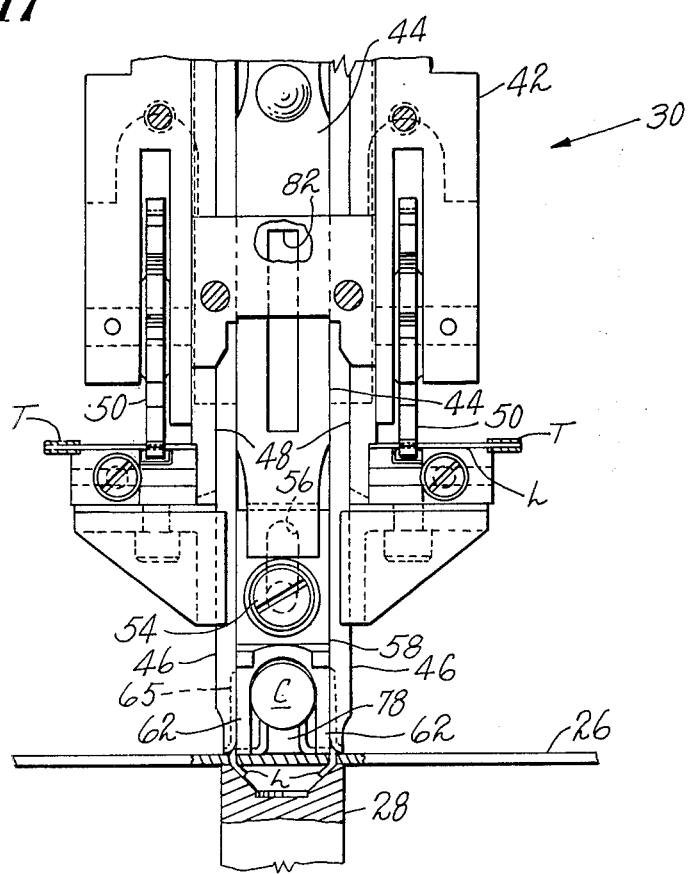
Figure 18:
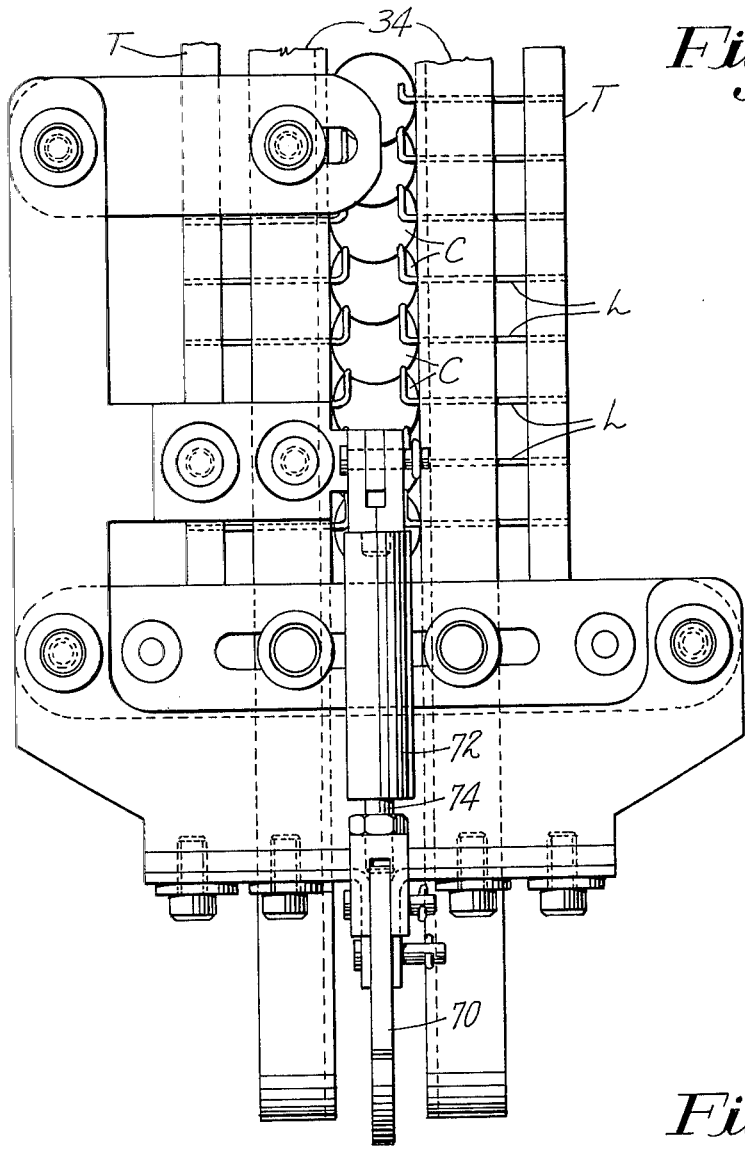
FIG. 18 is a front view, taken normal to the raceway, of the tape-fed disc caps therein and means to predeterminedly position successive components in the head.
Figure 19:
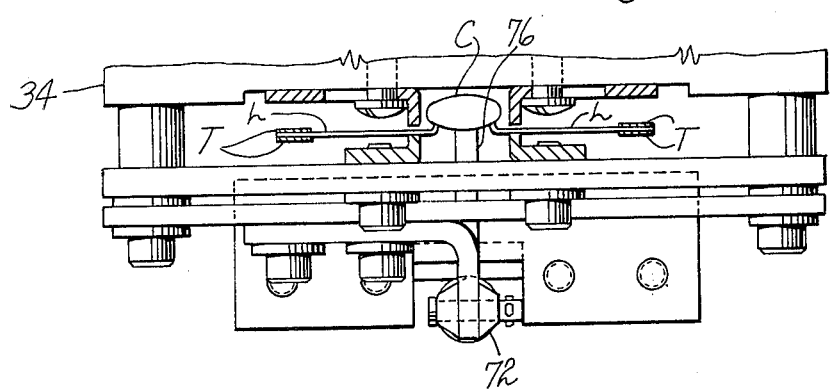
FIG. 19 is a view taken transversly of the raceway shown in FIG. 18.

In FIG. 3 an illustrative component inserting machine generally designated 20 has a C-frame 22 mounted at one of a plurality of stations along a printed circuit board conveyor 24, though it will be understood the machine 20 may be mounted for operation by itself on a suitable support. Circuit boards 26 (FIGS. 1–3, 11, 16 and 17) preformed with sets of spaced lead-receiving holes are appropriately positioned over suitable lead clinching means 28 (FIGS. 3 and 17). Power means and control means for cyclically actuating an inserting head generally designated 30 (FIGS. 3 and 4) and carried by the frame 22 may be assumed to substantially correspond with the disclosure set forth in the above cited Alderman et al U.S. Pat. No. 3,896,213, except in certain novel respects hereinafter to be explained.

As shown in FIGS. 1, 2, 18 and 19 disc capacitors C to be mounted have their respective leads L, L preferably previously shaped so that shorter parallel and radial projecting portions extend from the bodies and outer end portions are coaxially disposed and held in spaced parallel relation by tapes T, T. Bodies of the capacitors C may accordingly be maintained in overlapping relation as they are successively advanced, by means later referred to, from a supply reel 32 (FIG. 3) through a raceway 34 secured to the head 30 by a bracket 36 (FIG. 4), and the coaxial lead portions of successive endmost components are delivered onto the lower end portion of a pivotal inside former 38 (FIGS. 4–14) and onto spaced shear blocks 40, 40 secured to the bottom of a housing 42 of the head 30.

In an arrangement generally resembling construction of the mentioned Alderman et al patent, operating instrumentalities in the head in addition to the inside former 38 include a vertically reciprocable driver bar 44 (FIGS. 4, 7–14), outside formers 46, 46 disposed for heightwise movement one on each side of the driver bar 44, and cutter bars 48, 48 reciprocable vertically at opposite outer sides of the outside formers 46, 46, respectively, for cooperation with the shear blocks 40, 40. The organization preferably includes ball and socket detent means as hitherto disclosed in the Alderman et al patent whereby the cutters 48 and the outside formers 46 successively partake of portions of the descent of the driver bar 44 sequentially to sever the leads to selected lengths and then direct the leads through a selected pair of circuit board holes. Also, as fully disclosed in that patent, unwinding of the reel 32 and advance through the raceway of the successive taped components is effected by a pair of circumferentially notched lead-engaging feed wheels 50, 50 coaxially journalled in the housing 42, the wheels 50 being indexed in steps (clockwise as seen in FIG. 4) by pawl and lever mechanism generally designated 52 (FIG. 4) operatively connected to the driver bar 44.

Figure 14:
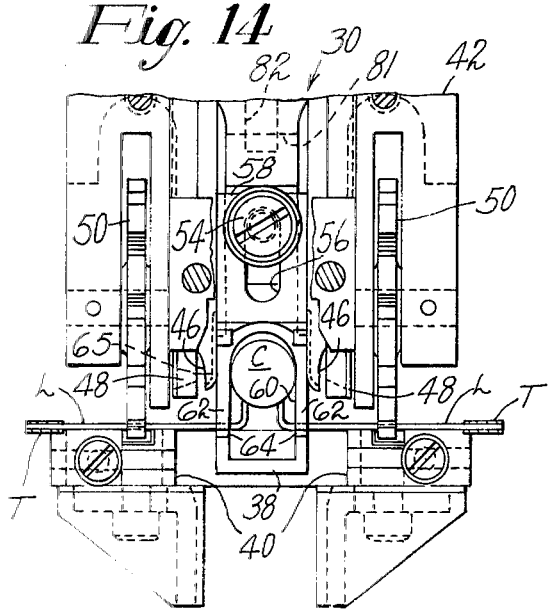
FIG. 14 is a view similar to FIG. 12 but showing the parts at a next stage in the cycle wherein the hold-down means has clamped lead portions to the inside former.
Figure 15:
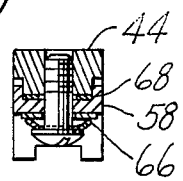
FIG. 15 is a section taken on the line XV—XV in FIG. 12.
Figure 16:
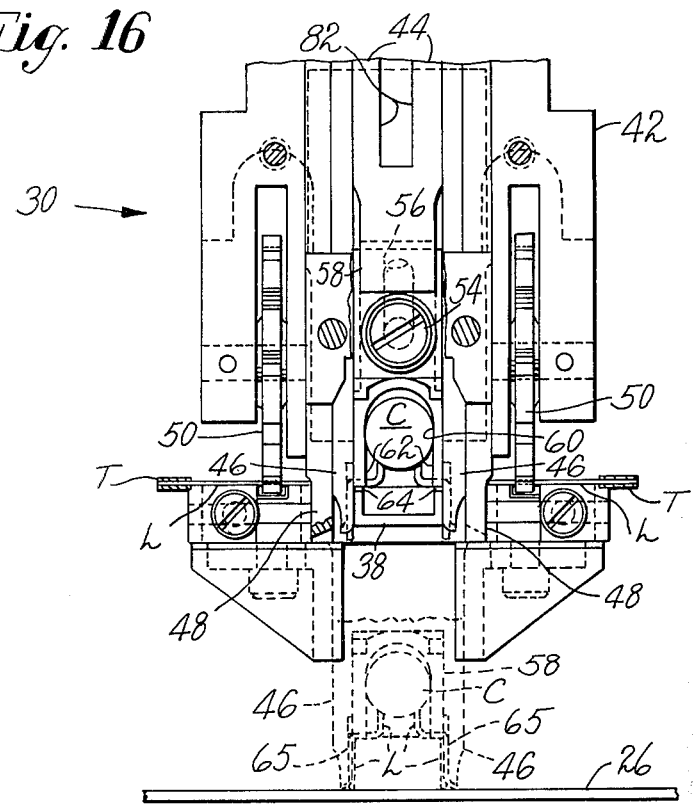
FIGS. 16 and 17 are front elevations of the head showing successively the lead forming and insertion-clinching, respectively.

Mechanism next to be explained is provided for insuring that at least parts of the coaxial lead portions of each successive endmost component C to be mounted are held stationary on the inside former during lead cutting and bending and then reliably guided during inserting. To this end a side of the lower end of the driver bar 44 is recessed and bored to threadedly receive a clamping screw 54 (FIGS. 4, 7–17) which extends through a vertical lost motion slot 56 in a frictional hold-down 58. Referring particularly to FIGS. 12, 14–17, the hold-down 58 is formed with a recess 60 for accomodating with clearance the body of each disc capacitor C when vertically disposed, and a pair of depending, grooved lead clamping feet 62, 62 spaced at opposite sides of the recess 60. The feet 62, as best shown in FIG. 14, are thus arranged to clamp coaxial lead portions of component C on oppositely spaced portions 64, 64 of the U-shaped end of the inside former 38. As shown in FIG. 15, the head of the screw 54 bears on a spring washer 66 causing the hold-down 58 to exert pressure on a suitable friction washer 68 confined against a vertical side of the driver bar. It will be appreciated that friction exerted by the driver on the hold-down 58 can accordingly be adjusted by turning the screw 54. Descent of the driver 44 in the first part of a forming and inserting cycle is consequently accompanied by a lowering of the hold-down feet 62, 62 into lead clamping positions against the shoulder forming surfaces 64, 64 of the inside former, and the lost motion slot 56 allows this lead clamping to continue while lead severance is effected by the cutters and then during formation of the stand-off lead shoulders by the outside formers 46 cooperating with the inside former 38. Using a frictional hold-down as a lead clamp, in contrast to a spring actuated clamp, avoids energy storage in the clamp which could be released and prematurely eject the component.

Figure 13:
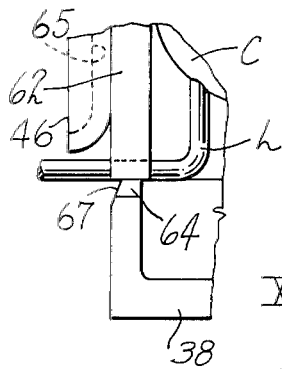
FIG. 13 is an enlarged detail of an end portion of the inside former.
Figure 13A:
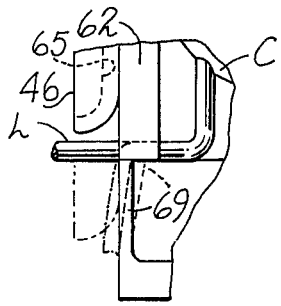
FIG. 13a is an end view of the lead supporting end of an alternate form of an inside former laterally deflectible to aid in lead spring-back.

A rather critical and important feature to note is that outer sides adjacent to each of the leading clamping surfaces 64, 64 of the inside former are slabbed off or otherwise relieved as shown in FIG. 13 at 67 at an angle of approximately 10° to 20°, usually preferably about 15° to the vertical. This slight bevelling or rounding off of the inside former sides insures that each lead portion wiped over the inside former by the outside former retains sufficient memory or spring-back resilience to be biased outwardly and slidably retained in grooves 65, 65 of the outside formers. As illustrated in an alternative inside former (FIG. 13a), in lieu of providing a relieved side surface 67 as shown in FIG. 13, an inside former 69 (or two discrete cooperating inside formers 69, 69) generally of relatively slender stock may suitably form the stand-off lead shoulders in cooperation with the outside formers, the requisite spring-back for lead retention in the outside former grooves 65 now being attained by enabling each inside former to laterally deflect inwardly in response to pressure transmitted through the lead wire being wiped and bent thereover by an outside former 46. It will be understood, moreover, that it will be within the scope of this invention to provide an inside former having a lead supporting portion which may be both angularly relieved and inwardly deflectable as aforesaid.

Figure 4:
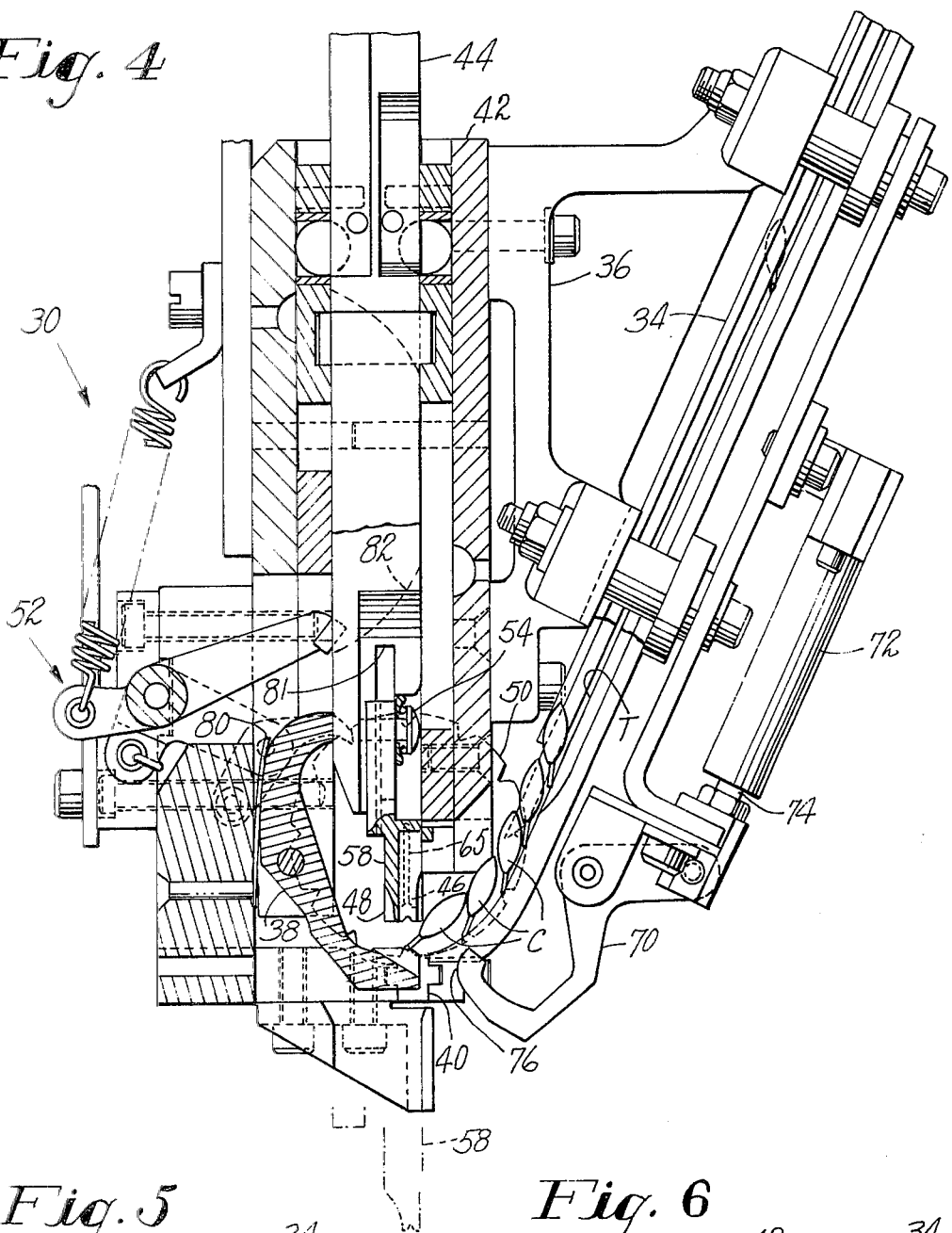
FIG. 4 is a vertical enlarged section through the head of the machine shown in FIG. 3 and revealing its instrumentalities including a driver bar having a hold-down means, lead formers and cutters, and a component feed means, the parts being in their respective positions at the start of the cycle.
Figure 5:
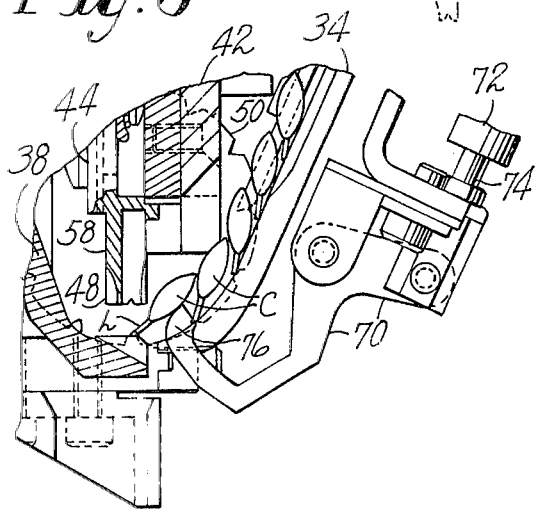
FIGS. 5 and 6 show successive positions of a device for transferring successive disc caps from the end of a raceway to a predetermined lead preparation position.
Figure 6:
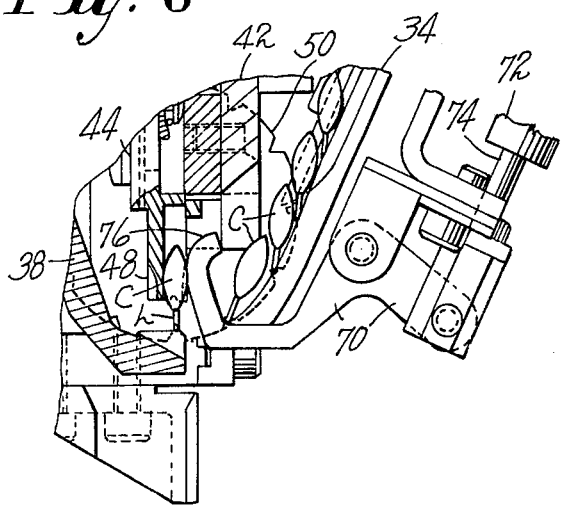

In order to shift each endmost component body from its inclined position at the lower end of the raceway 34 shown in FIG. 4 to an upright position within the upwardly retracted driver hold-down recess 60 as shown in FIG. 6 in preparation for lead formation and insertion, a lever 70 is cyclically pivoted by means next to be described. Bracketed to the raceway 34 is a fluid pressure operated cylinder 72 (FIGS. 4 and 18) having a piston (not shown) depressible against spring-return. A piston rod 74 is accordingly lowered in response to a signal given for the start of a machine cycle, the signal causing fluid pressure to be admitted to the cylinder 72, and a rounded free end 76 of the lever 70, which is connected to the rod 74, is thereupon thrust upwardly against the lowermost body C as shown in FIG. 5. The end 76 maintains the capacitor in this predetermined position against a vertical positioning surface 78 of the hold-down 58 as shown in FIGS. 7-9 inclusive until the driver bar 44 positively forces the hold-down past the end 76 to effect lead insertion. When the driver bar 44 is subsequently retracted upwardly to its starting position shown in FIG. 4 the lever 70 is returned counterclockwise to its starting position as there indicated in readiness to act on the next component C to be processed.

Figure 12:
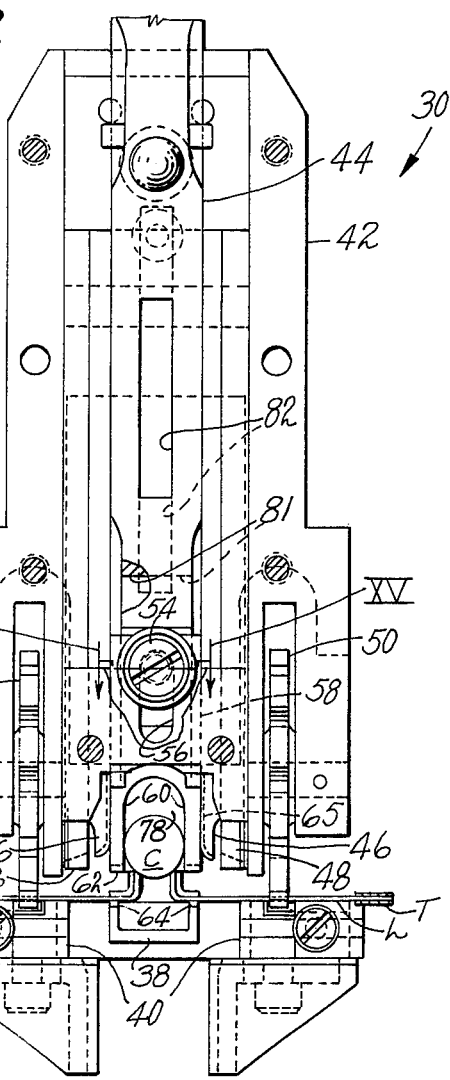
FIG. 12 is a view of the head in front elevation, with feed mechanism removed, ans showing parts in the relative positions indicated in FIG. 7.

Briefly to review operation of the machine, on signalling for start of a cycle of operations, power means (commonly actuated by fluid pressure) lowers the driver bar 44 from its retracted upper position shown in FIGS. 4 and 12, and simultaneously the lever 70 is pivoted to urge an end disc cap C upright into hold-down recess 60 against the positioning surface 78. The tapes T, T at the outer ends allow them to be turned about their common axis for this predetermined body positioning. The hold-down 58 at this initial stage, as shown in FIGS. 4 and 12, is in its relatively lowest position on the driver bar 44, the screw 54 then extending through the upper end of the slot 56; also, the inside former 38 is then maintained in its indicated forming position by reason of its upper extremity engaging a vertical flat side of the driver bar under the influence of a leaf spring 80.

By reason of the frictional coupling of the driver bar and the hold-down 58, the feet 62, 62 are caused to clamp inner coaxial lead portions L, L on the inside former surfaces 64, 64 (one shown in FIG. 13) respectively and hold these lead portions against movement throughout operation of the cutters 48 while freeing the component from the tapes T, T, and then during subsequent cooperation of the outside formers 46 with the inside former 38 on outward lead portions. Commonly the lead receiving grooves in the feet 62 and in the cutters 48 are aligned with the outside former grooves 65, 65 during lead shearing, but upon occasion the grooves disposed on one side of a center line through the component body may be offset from those disposed on the other side if need be in accommodating offset leads. As the outside formers 46 descend past the inside former surfaces 64, the leads L are wiped downwardly over the slabbed-off or relieved side surfaces of the inside former and caused to be bent substantially at right angles, each lead end portion being biased outwardly and slidably retained for endwise movement in the adjacent outside former grooves 65 and hence tending to be retained frictionally against the walls of the grooves. Thus there is no opportunity for the component C to become disassociated from the outside formers, and the lead ends are therefore directed precisely into their respective board receiving holes. It will be understood, comparing FIGS. 14 and 16, that in the interval of lead clamping concurrent with lead cutting and forming, the clamping pressure of suitable degree is provided by the friction imparted to the hold-down 58 by the driver bar 44 via the washer 68 as the hold-down is permitted by the lost motion slot 56 to slide relatively upward on the descending driver bar. Before the screw 54 can engage the bottom of the slot 56, the hold-down is positively moved further downwardly by engagement therewith of a shoulder 81 (FIGS. 4, 12) of the driver bar. As soon as the inside former is retracted, the hold-down is able to move downward with the driver bar and thus completes the insertion cycle, guided into the circuit board holes the leads being slidably by the outside former grooves 65, 65 as shown in FIG. 17 and thrust by the driver bar against the clinching means 28.

It will be appreciated that the inside former 38 is allowed, at the instant the substantially right angle lead shoulders are formed, to pivot (clockwise as shown in FIGS. 9-11) to a position from its lead supporting and forming position by reason of its upper extremity clearing the above mentioned flat side of the driver bar and swings into a recess 82 (FIG. 4) formed in the bar 44. Following lead clinching which securely mounts the component, the upward retraction of the driver bar operates the pawl and lever mechanism 52 whereby the wheels 50, 50 advance a next endmost component C to be mounted into position to be engaged by the positioning lever 70 in the ensuing cycle. Such upward return to starting position of the driver bar, cutters and outside formers also causes the screw 54 (by reason of its overcoming washer friction and now engaging the upper end of the slot 56) to restore the hold-down 58 to its initial relatively lower most position on the driver bar 44 in readiness for the next cycle.

From the foregoing it will become apparent that the invention provides a compact and reliable lead forming and inserting machine which is adaptable for processing different components to be mounted in stand-off manner. Moreover, with minor adaptation of the machine and without departing from the invention the machine can also be employed to insert non stand-off type components. Loose mounts as suggested by FIG. 1, for instance, and misinsertions are practically all elliminated.

Having thus described our invention what we claim as new and desire to secure as Letters Patent of the United States is:

1. In a machine for mounting electronic components having coaxial leads, portions of which leads are to be bent to extend in parallel relation into preformed circuit board holes, a reciprocable driver bar movable toward and from the circuit board, a hold-down having a lost motion connection to the driver bar, said hold-down having spaced, grooved feet engageable with the coaxial lead portions, respectively, and friction means interengageable with the driver bar and the hold-down for causing the latter yieldingly to bear on said coaxial lead portions before the driver bar acts positively to insert the parallel lead portions into the holes.

2. A machine as in claim 1 wherein the hold-down is formed with a recess for accommodating a component body and defined in part by a body positioning surface, means including a raceway having a delivery end for feeding successive components in parallel lead relation to the vicinity of the hold-down when retracted from the circuit board by the driver bar, and power means for transferring successive endmost components from said delivery end into the retracted hold-down recess to be predeterminedly positioned by said surface.

3. In an inserting machine having instrumentalities including an outside former for forming and mounting the leads of electronic components, the improvement which consists in providing an inside former with an end portion deflectable laterally inward by a lead portion being wiped and bent thereover by the outside former.

4. In a machine for forming and inserting coaxial portions of leads extending from component bodies to be mounted on a circuit board, inserting mechanism movable toward and from the board, said mechanism having in one end portion a recessed positioning surface, cutters and cooperative lead forming means sequentially operable during a portion of the movement of the inserting mechanism toward the board, means for carrying the components by their coaxial lead portions and spaced side-by-side with their bodies generally aligned with, but disposed at an angle to, the path of said surface, guide means for causing the component carrying means to deliver the leads of each successive endmost component to a predetermined position with respect to the lead forming mechanism, and a cyclically operable member for engaging each endmost component body at said position to angularly shift said body about the general axis of its coaxial lead portions and against said positioning surface prior to operation of the lead cutting and forming means on the lead portions associated with said body.

5. In a machine for forming and inserting leads extending in part coaxially and at least partly projecting radially or generally parallel from a component body such as that of a disc capacitor to be mounted on a circuit board or the like, a head comprising lead cutting and forming instrumentalities, a driver bar movable cyclically in the head to operate these instrumentalities and then thrust the formed leads endwise into the circuit board, and means comprising a hold-down member adjustably frictionally coupled to the driver bar for predeterminedly positioning and clamping a portion of the respective leads intermediate their body and the locality of operation of the lead forming instrumentalities whereby the latter can thereafter cooperate with the lead clamping means in accurately directing each formed lead into the circuit board.

6. A machine as in claim 5 wherein the hold-down member is formed with a slot for slidably receiving a clamping screw adjustably threaded into the driver bar, and a friction material is disposed between the bar and the hold-down whereby said feet exerted lead clamping pressure derived from the initial portion of an operating stroke of the bar and said pressure is maintained via the friction material throughout lead forming.

7. In a machine for forming and inserting the leads of components respectively having a pair of leads including stand-off spaced parallel portions projecting from their component bodies and coaxial outer portions to be formed and inserted, a reciprocable driver bar and lead forming means operable during a portion of the stroke of the driver bar, lead clamping means operatively connected to the driver bar and including a positioning surface for abutting each component body and spaced feet for bearing on said coaxial outer portions of the leads, said lead forming means including an inside former and cooperative outside formers, the inside former having spaced lead supporting surfaces against which the lead clamping feet bear during operation of the outside formers, and friction means actuated by the driver bar for causing the clamping feet thus to bear from a time prior to the cooperation of said formers.

8. A machine as in claim 7 wherein means is provided for supplying successive tape-fed components with their bodies in overlapped relation to a delivery position adjacent to the locality of cooperation of said formers, and means operative alternatively with inserting strokes of the driver bar for transferring successive endmost component bodies from said delivery position into predetermined relation to said positioning surface of the lead clamping means.

9. In a machine for forming and inserting leads of components having substantially coaxial lead portions to be mounted on a circuit board, a vertically reciprocable driver bar movable toward and from the board, cutters and cooperative lead forming means sequentially operable on said coaxial lead portions during a portion of the movement of the driver bar toward the circuit board, a hold-down means actuatable during said portion of the driver bar movement to immobilize at least spaced parts of the coaxial lead portions before and during operation of the cutters and forming means thereon, means for supplying successive components in predetermined position between the hold-down means on the one hand and the cutters and forming means on the other hand when the driver bar is retracted from the circuit board, said component supplying means comprising a pair of circumferentially notched feed wheels for cyclically advancing coaxial pairs of leads of the respective components toward the cutters and forming means, said components being interconnected by means of tape in parallel, spaced lead formation with their component bodies overlapping, a member automatically shiftable to urge the endmost component about the axis of its coaxial leads to predeterminedly position the body of said component relative to said hold-down means in each cycle, and power means for controlling operation of the driver bar, the hold-down means, and the supplying means in sequence.

* * * * *